United States Patent
Berlin et al.

(10) Patent No.: US 7,307,841 B2
(45) Date of Patent: Dec. 11, 2007

(54) ELECTRONIC PACKAGE AND METHOD OF COOLING ELECTRONICS

(75) Inventors: Carl W. Berlin, West Lafayette, IN (US); Suresh K. Chengalva, Kokomo, IN (US); Scott D. Brandenburg, Kokomo, IN (US); Bruce A. Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 211 days.

(21) Appl. No.: 11/191,822

(22) Filed: Jul. 28, 2005

(65) Prior Publication Data

US 2007/0025081 A1    Feb. 1, 2007

(51) Int. Cl.
*H05K 7/20* (2006.01)
*F28F 7/00* (2006.01)
*H01L 23/34* (2006.01)

(52) U.S. Cl. ............ 361/699; 165/80.4; 257/706; 257/712; 257/714; 361/717; 361/719; 361/722

(58) Field of Classification Search ........ 257/714–716; 361/688–689, 699, 716–718, 722
See application file for complete search history.

(56) References Cited

U.S. PATENT DOCUMENTS

| | | | | |
|---|---|---|---|---|
| 4,912,548 A * | 3/1990 | Shanker et al. ............ 257/715 |
| 5,270,572 A * | 12/1993 | Nakajima et al. ........... 257/714 |
| 5,349,831 A * | 9/1994 | Daikoku et al. ............. 62/376 |
| 5,373,417 A * | 12/1994 | Barrett ...................... 361/699 |
| 5,901,037 A * | 5/1999 | Hamilton et al. ........... 361/699 |
| 6,175,495 B1 * | 1/2001 | Batchelder .................. 361/695 |
| 6,377,458 B1 * | 4/2002 | Morris et al. ............... 361/699 |
| 2005/0077614 A1 | 4/2005 | Chengalva et al. ......... 257/706 |
| 2005/0168947 A1 * | 8/2005 | Mok et al. .................. 361/698 |
| 2006/0007656 A1 * | 1/2006 | Symons ..................... 361/699 |

OTHER PUBLICATIONS http://www.temperatures.com/bimel.html, *Bimetallic Thermometers and Thermostats*, "How Thermometers Work" by Marshall Brain, ©1998-2007 HowStuffWorks, Inc., 5 pages.
http://www.piezo.com/prodfan1vac.html, 115VAC/60Hz Piezo Fan Blade, Piezo Systems, Inc., Catalog #7, 2006, cover page and p. 12.
http://www.piezo.com/prodfan3lv02.html, 12-15 VDC/Low Power Piezo Fan Blade and Fan Kit, Piezo Systems, Inc., Catalog #7, 2006, cover page and p. 13.

* cited by examiner

*Primary Examiner*—Gregory Thompson
(74) *Attorney, Agent, or Firm*—Jimmy L. Funke

(57) ABSTRACT

An electronic package having circulated submersed cooling fluid and method are provided. The electronic package has a housing defining a sealed enclosure and electronic devices located in the housing. The electronic devices have thermal emitting electrical circuitry. A dielectric fluid, such as a liquid, is located in the housing in heat transfer relationship with the electronic devices. A fluid circulator, such as a piezo fan, is located in the housing in contact with the dielectric liquid for circulating the dielectric liquid to cool the electronic devices.

21 Claims, 3 Drawing Sheets

ELECTRONIC PACKAGE AND METHOD OF COOLING ELECTRONICS

TECHNICAL FIELD

The present invention generally relates to the cooling of heat generating electronics and, more particularly, to an electronic package having thermal energy cooling for dissipating heat away from the electronic device(s).

BACKGROUND OF THE INVENTION

Electronic packages typically employ semiconductor devices, such as flip chips, Insulated Gate Bipolar Transistor (IGBT) chips and other electronics. Electronic packages, such as those used in electronic control modules (ECM), generally contain electrical circuitry often implemented as integrated circuitry including electronic components, such as transistors and resistors. The electrical circuitry conducts electrical current which, in turn, typically generates thermal energy (i.e., heat).

Electronic packages are often equipped with a housing for protecting the electrical circuit components from damage due to moisture and contact. The generated thermal energy within the electronic package generally results in increased temperature. Excessive heat build-up within certain electronic packages may lead to adverse effects including electrical circuit failure. Thus, it is desirable to dissipate heat away from the electronic package and the electronic device(s) contained therein.

Conventional techniques for dissipating thermal energy away from an electronic package include the use of a thermally conductive heat sink supported in contact with the package. This may include directly mounting a heat sink onto a printed circuit board which, in turn, contains the electronic devices. The heat sink transfers heat that dissipates through the printed circuit board away from electronic devices. One example of a prior electronic package is disclosed in U.S. Patent Application Publication No. 2005/0077614 A1, the entire disclosure of which is hereby incorporated herein by reference.

Other conventional heat dissipation techniques employ the use of air cooled fans to blow ambient air onto the electronic package. The air from the surrounding environment is forcibly circulated to pass by the electronic package or circuit components. In doing so, the forced air exchanges heat via convection and dissipates the heat to the surrounding environment.

While many conventional electronic cooling approaches dissipate some of the thermal energy away from the electronic device, such approaches generally do not offer optimal heat dissipation. The resultant heat dissipation realized in conventional electronic packages often results in large package size and reduced power constraints.

Accordingly, it is therefore desirable to provide for an electronic package and method of dissipating thermal energy (heat) away from the electronic device(s) in an optimal manner.

SUMMARY OF THE INVENTION

According to one aspect of the present invention, an electronic package having submersed fluid cooling is provided. The electronic package has a housing defining sealed enclosure and an electronic device located in the housing. The electronic device has thermal energy emitting electrical circuitry. The electronic package also includes a fluid located in the housing in heat transfer relationship with the electronic device. The electronic package further includes a fluid circulator located in the housing in contact with the fluid for circulating the fluid to cool the electronic device.

According to a further aspect of the present invention, a method of cooling an electronic device in a package is provided. The method includes the steps of disposing an electronic device in a housing defining sealed enclosure and providing fluid in the housing in heat transfer relation to the electronic device. The method also includes the step of energizing the electronic device such that electronic circuitry generates thermal energy. The method further includes the step of circulating the fluid in thermal contact with the electronic device to cool the electronic device.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
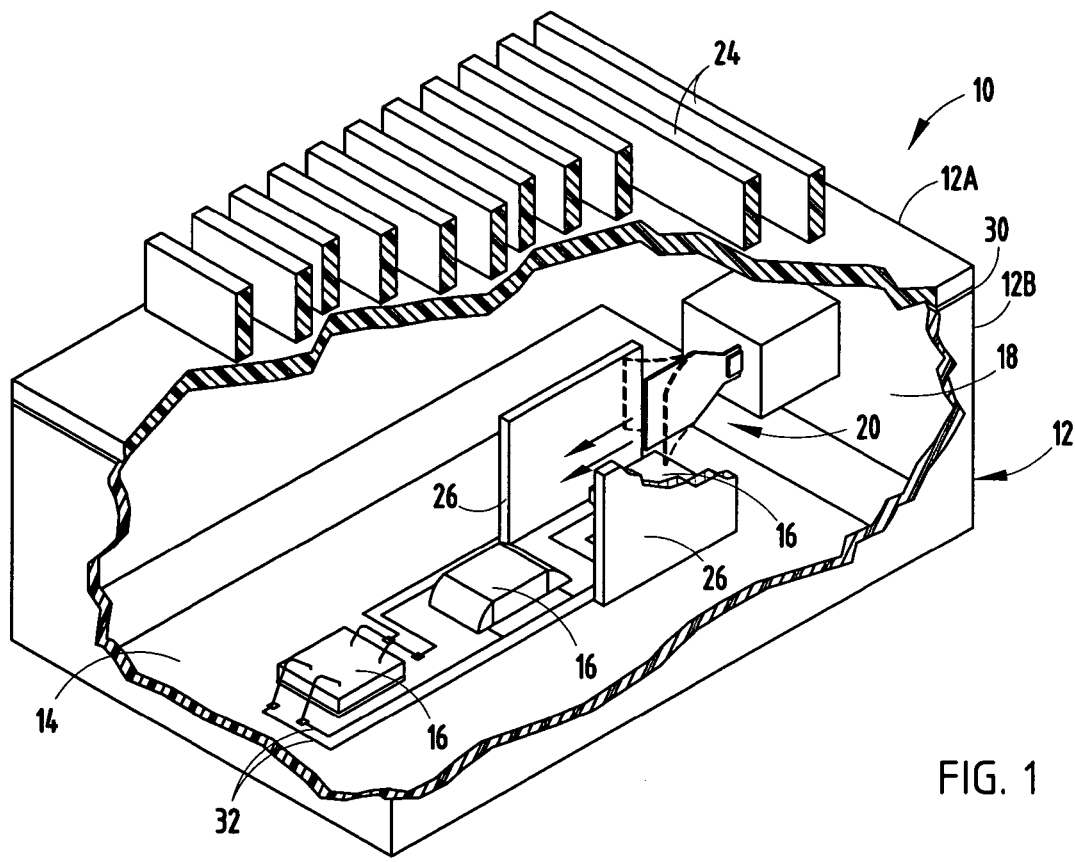
FIG. 1 is a partially broken away perspective view of an electronic package according to a first embodiment of the present invention.
Figure 2:
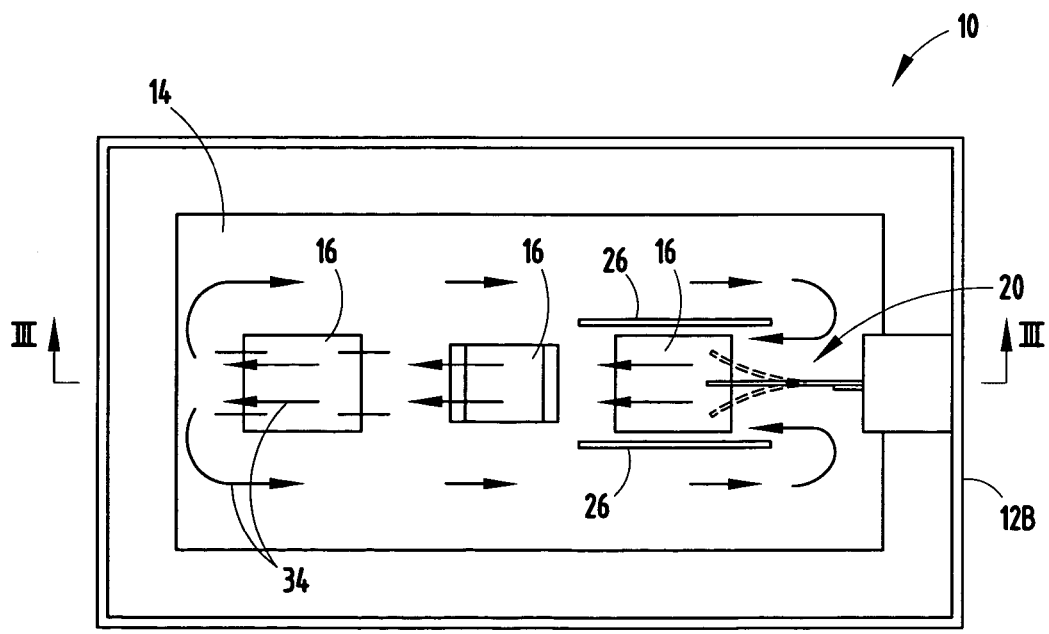
FIG. 2 is a top view of the electronic package of FIG. 1 with the top wall removed.
Figure 3:
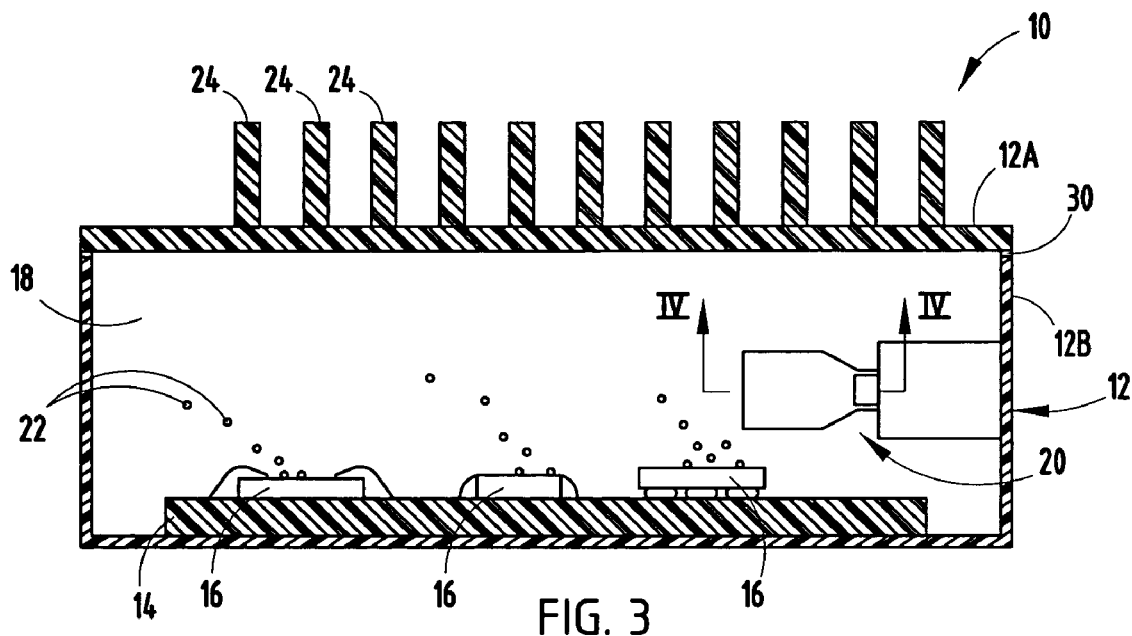
FIG. 3 is a cross-sectional view of the electronic package taken through lines III-III in FIG. 2.

Referring to FIGS. 1-3, an electronic package 10 is generally illustrated according to a first embodiment of the present invention. The electronic package 10 includes a thermally conductive housing 12 having a base 12B made up of four generally rectangular side walls and a bottom wall and a cover 12A generally defined by a top wall. The cover 12A is sealed via a seal (e.g., gasket) 30 and fasteners (e.g., threaded screws) (not shown) to the base 12B to define a sealed enclosure that prevents ingress and egress of fluid. The housing 12 may be made of a diecast metal that is thermally conductive to transmit thermal energy (heat) from within the enclosure of housing 12 to the outside ambient environment.

Disposed within the enclosure of housing 12 is a substrate 14, such as a printed circuit board, shown located on the interior surface of the bottom wall. The substrate 14 may be made of low temperature co-fired ceramic (LTCC), an organic material such as FR4, a metal such as stainless steel, or any other suitable material. The substrate 14 may have electrical circuitry 32 formed on the top and/or bottom surfaces as well as between laminated layers of the substrate 14.

Fabricated on top of the printed circuit board 14 are three-electronic devices 16 having electrical circuitry that generates thermal energy (heat) when conducting electrical current. Any number of the electronic devices 16 may be employed which may include one or more semiconductor devices, such as transistors configured to provide controlled switching operation, operate as a diode, provide voltage regulation, or perform other functions. The electronic devices 16 may be fabricated semiconductor chips, such as flip chips with wire bonded or solder bump connections that are electrically and/or physically coupled to the substrate 14. According to other examples, the electronic devices 16 may include resistors, capacitors and other electrically operated devices.

It should be appreciated that the electronic devices 16 are electrically coupled to circuitry 32 on or within the printed circuit board 14 and may receive electrical power and communicate with each other and outside devices via a sealed communication link (not shown). In one application, the electronic package 10 may be employed as an electronic control module (ECM) for use on a vehicle. However, it should be appreciated that any sealed electronic package may employ the teachings of the present invention for use to cool one or more electronic devices 16 for use onboard a vehicle or off a vehicle.

Also disposed within the enclosure of housing 12 is a fluid 18. Fluid 18 may be a dielectric fluid that transfers heat and prevents electrically short-circuiting between electrical circuit elements, according to one embodiment. According to a more specific embodiment, the dielectric fluid 18 is a dielectric liquid that submerges the electronic devices 16. Dielectric liquid 18 is electrically insulative and thus resists electrical current transmission therethrough. Thus, the dielectric fluid 18 prevents unintentional short circuiting among electrically conductive components. Additionally, the dielectric liquid 18 is thermally conductive and in heat transfer relation on the electronic devices 16 to transfer thermal energy from the electronic devices 16 to housing 12 where thermal energy dissipates to the outside environment.

Examples of suitable dielectric fluid 18 include Fluorinert™ electronic liquid FC-43 and Fluorinert™ electronic liquid FC-77, both commercially available from 3M. Another example of dielectric fluid 18 includes perfluorinated fluids, such as Flutec® PP9 commercially available from F2 Chemicals Ltd. A further example of dielectric fluid 18 includes Galden D-03 commercially available from Ausimont S.p.A.

The electronic package 10 includes one or more fluid circulators, such as piezo fan 20, disposed in the dielectric fluid 18 for circulating the dielectric fluid 18 within the sealed enclosure of housing 12. Each fluid circulator 20 circulates the dielectric fluid 18 over the surface of the electronic devices 16 to enhance the heat transfer dissipation from the electronic devices 16. Additionally, the fluid circulator 20 produces turbulence in the dielectric fluid 18 that dislodges low thermally conductive air bubbles 22 from heated surfaces of the electronic devices 16, as seen in FIG. 3. The air bubbles 22 may form on a heated surface of the electronic devices 16 and, due to the turbulence of the dielectric fluid 18, the air bubbles 22 are released and move away from the electronic devices 16. This results in enhanced thermal energy dissipation from the electronic devices 16.

Figure 4:
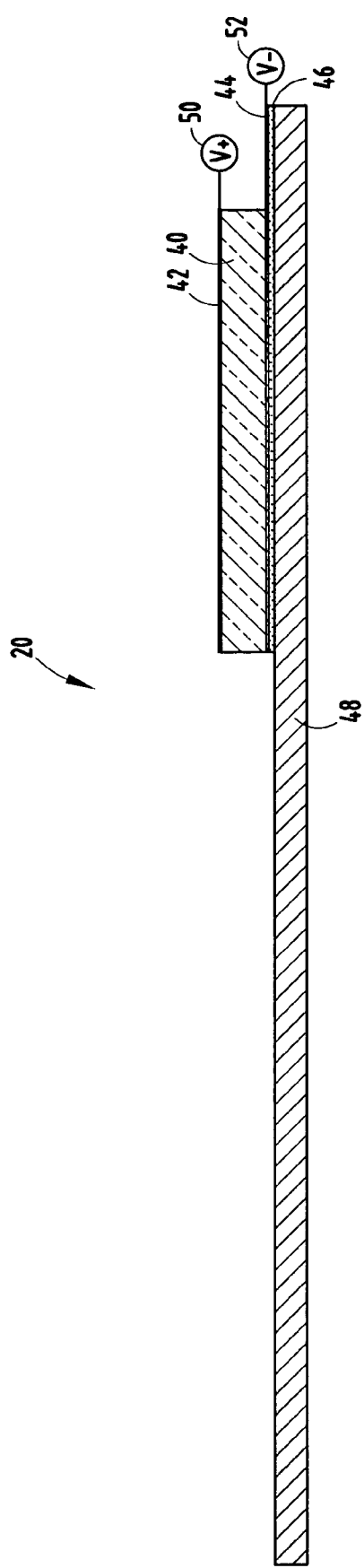
FIG. 4 is an enlarged cross-sectional view of the piezo fan taken through lines IV-IV of FIG. 3.

According to the first embodiment, the fluid circulator 20 may include a piezo fan. The piezo fan 20 is further illustrated in FIG. 4 having a piezoceramic 40 with an overlying first nickel electrode 42 and underlying second nickel electrode 44. The piezoceramic 40 may include PZT (lead, zirconate, titanate). The piezoceramic 40 with electrodes 42 and 44 is adhered via adhesive layer 46 onto a fan blade 48. Fan blade 48 may include a sheet of brass, steel, plastic, as well as other suitable materials that bend in response to expansion and contraction of the piezoceramic 40 to create a fanning effect.

The piezoceramic 40 is located on a surface of the fan blade 48. Alternatively, piezoceramic layers could be located on both top and bottom surfaces of the fan blade 48. Electrodes 42 and 44 are electrically energized to create a polarization field through piezoceramic 40. The first electrode 42 is coupled to a first input 50 for receiving voltage input V+. Similarly, the second electrode 44 is coupled to a second input for receiving a second voltage V−. It should be appreciated that the voltage applied to inputs 50 and 52 may include a sinusoidal alternating sine wave having a voltage amplitude of ±24 volts and out of phase by one hundred eighty degrees (180°), according to one example.

When an electrical field is applied to one surface, such as the top surface of the piezoceramic 40, the piezoceramic 40 expands in the thickness or longitudinal direction (i.e., along the axis of polarization) and contracts in the transverse direction (perpendicular to the axis of polarization). When the electric field is reversed, the motions are reversed. By reversing the electric field at the rate of the sine wave resonant frequency, a transverse motion of the piezoceramic 40 is achieved which, in turn, induces the underlying fan blade 48 to stretch or bend, thereby creating a fanning oscillation effect to circulate the dielectric fluid 18. One example of a commercially available piezo fan is Model No. RFN1-005, commercially available from Piezo Systems, Inc.

Additionally, the cover 12A of housing 12 is shown in thermal conductive contact with a plurality of cooling fins 24. The cover 12A may be formed of a diecast metal case which has the plurality of upstanding cooling fins 24 formed on the top surface and generally made of the same thermally conductive material as the diecast cover 12A. The cooling fins 24 and the remaining diecast metal cover 12A and base 12B of housing 12 transmit thermal energy received from the dielectric fluid 18 to the surrounding environment. The cooling fins 24 provide a large surface area for dispensing the thermal energy to the ambient air in the surrounding environment by way of convection.

Referring back to FIGS. 1 and 2, the electronic package 10 is generally illustrated further including a pair of baffles 26 generally disposed to the sides of the piezo fan 20 to control the circulation of dielectric liquid 18 within housing 12. Baffles 26 allow dielectric liquid 18 circulated by piezo fan 20 to pass in a controlled fluid flow path 34 to flow across the electronic devices 16, thereby optimizing the circulation of dielectric fluid 18 to cool the electronic devices 16. The baffles 26 are shown centered over one of the electronic devices 16.

Figure 5:
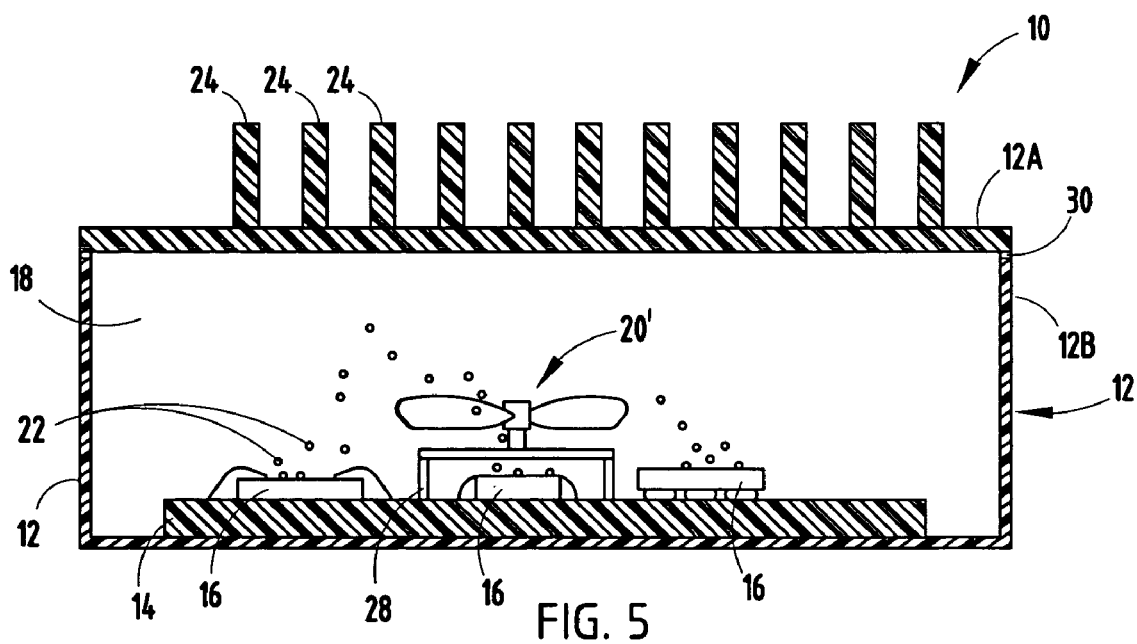
FIG. 5 is a side cross-sectional view of an electronic package employing a rotary fan according to a second embodiment.

Referring to FIG. 5, the electronic package 10 is further illustrated having a microrotary fan 20' according to a second embodiment. The microrotary fan 20' is shown mounted on a support frame 28 above an electronic device 16. The microrotary fan 20' is a submersible rotary blade fan that circulates dielectric fluid 18 within the sealed enclosure such that fluid 18 passes in contact with electronic device(s) 16 to provide cooling of the electronic device(s) 16. The thermal energy from electronic device(s) 16 is thereby effectively transferred to the dielectric fluid 18, then to the housing 12 and to the outside surrounding environment.

Accordingly, the electronic package 10 of the present invention employs one or more cooling fluid circulators 20 or 20' for circulating dielectric fluid 18 within housing 12 to pass in heat transfer relationship with one or more electronic devices 16 to cool the electronic devices 16. By employing a circulated dielectric fluid 18, such as liquid, in heat transfer relationship to the electronic devices 16, the electronic package 10 advantageously dissipates thermal energy (heat) away from the electronic devices 16 in an optimal manner to achieve reduced temperature operating conditions. The cooling is achieved in three phases; one phase from the electronic device 16 to the dielectric fluid 18, the second phase from the fluid 18 to the housing 12, and the third phase from the housing 12 to the outside ambient environment. This allows for use of a more compact housing 12 and/or more electronics or higher current electronic devices within a package without suffering from adverse elevated temperature.

While the electronic package 10 is shown and described herein in connection with multiple embodiments employing cooling fans 20 or 20', it should be appreciated that other types and any number of one or more fluid circulators may be employed in the electronic package 10 without departing from the teachings of the present invention. For example, other electrically operated fans may be employed at various locations to circulate the cooling dielectric fluid 18, particularly a liquid, in heat transfer relationship with the electronic devices 16. It should also be appreciated that any of a number of electronic devices 16 may be employed within the electronic package 10 and mounted on one or more substrates, such as printed circuit board 14. Further, the substrate 14 and electronic devices 16 may alternately be configured to allow dielectric fluid 18 to flow on the bottom surface by elevating the substrate 14 in housing 12 such as via pedestals. The substrate 14 may also have fluid flow passages extending therethrough to further enhance the heat transfer.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An electronic package having submersed fluid cooling, said package comprising:
    a housing defining a sealed enclosure;
    an electronic device located in the housing, said electronic device having thermal energy emitting electrical circuitry;
    a fluid located in the housing in heat transfer relationship with the electronic device; and
    a fluid circulator comprising a piezo fan located in the housing in contact with the fluid for circulating the fluid to cool the electronic device, wherein said piezo fan creates a fanning oscillation effect to circulate the fluid.

2. The electronic package as defined in claim 1, wherein the fluid comprises a dielectric fluid.

3. The electronic package as defined in claim 1, wherein the fluid comprises a dielectric liquid.

4. The electronic package as defined in claim 1, wherein the fluid circulator produces turbulence in the fluid to dislodge thermally conductive bubbles from a heated surface of the electronic device.

5. The electronic package as defined in claim 1 further comprises one or more baffles for directing fluid flow circulated by the fluid circulator.

6. The electronic package as defined in claim 1, wherein the housing is thermally conductive.

7. The electronic package as defined in claim 6 further comprising cooling fins disposed in thermal conductive relationship to the housing for dissipating heat energy away from the housing.

8. The electronic package as defined in claim 1, wherein the package comprises a plurality of electronic devices located in the housing and in heat transfer relation to the fluid.

9. The electronic package as defined in claim 1, wherein the piezo fan comprises a piezoceramic, a first electrode, a second electrode and a fan blade, wherein electrical energization applied to the first and second electrodes creates a polarization field through the piezoceramic to cause the fan blade to create the fanning oscillation effect.

10. The electronic package as defined in claim 9, wherein the piezoceramic comprises lead, zirconate and titanate.

11. The electronic package as defined in claim 9, wherein the first and second electrodes are energized with a sinusoidal alternating sine wave.

12. A method of cooling an electronic device in a package, said method comprising the steps of:
    disposing an electronic device in a housing defining a sealed enclosure;
    providing fluid in the housing in heat transfer relation to the electronic device;
    energizing the electronic device such that electrical circuitry generates thermal energy; and
    energizing a piezo fan to create a fanning oscillation effect to circulate the fluid within the enclosure to cool the electronic device.

13. The method as defined in claim 12, wherein the step of providing fluid comprises providing dielectric fluid.

14. The method as defined in claim 12, wherein the step of providing fluid comprises providing dielectric liquid.

15. The method as defined in claim 12, wherein the step of circulating the fluid comprises generating turbulence in the fluid to dislodge thermally conductive bubbles from a heated surface of the electronic device.

16. The method as defined in claim 12 further comprising the step of directing the circulating fluid in a path with one or more baffles.

17. The method as defined in claim 12 further comprising the step of dissipating heat via a thermal conductive medium of the housing.

18. The method as defined in claim 17 further comprising the step of providing a plurality of cooling fins in thermal conductive relationship to the housing to further dissipate thermal energy away from the housing.

19. The method as defined in claim 12, wherein said step of energizing a piezo fan comprises applying electrical energization to first and second electrodes to create a polarization effect through a piezoceramic, wherein the piezoceramic expands and contracts to cause a fan blade to create the fanning oscillation effect.

20. The method as defined in claim 19, wherein the piezoceramic comprises lead, zirconate and titanate.

21. The method as defined in claim 19, wherein said step of applying electrical energization comprises applying a sinusoidal alternating sine wave signal to the first and second electrodes.

* * * * *